United States Patent
Wu et al.

(10) Patent No.: US 11,985,824 B2
(45) Date of Patent: May 14, 2024

(54) THREE-DIMENSIONAL MEMORY DEVICES HAVING DUMMY CHANNEL STRUCTURES AND METHODS FOR FORMING THE SAME

(71) Applicant: YANGTZE MEMORY TECHNOLOGIES CO., LTD., Wuhan (CN)

(72) Inventors: Jianzhong Wu, Wuhan (CN); Jingjing Geng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 785 days.

(21) Appl. No.: 17/084,315

(22) Filed: Oct. 29, 2020

(65) Prior Publication Data

US 2022/0077180 A1 Mar. 10, 2022

Related U.S. Application Data

(63) Continuation of application No. PCT/CN2020/113925, filed on Sep. 8, 2020.

(51) Int. Cl.
*H01L 27/11582* (2017.01)
*H10B 43/27* (2023.01)
*H01L 21/02* (2006.01)

(52) U.S. Cl.
CPC .......... *H10B 43/27* (2023.02); *H01L 21/0223* (2013.01); *H01L 21/02255* (2013.01)

(58) Field of Classification Search
CPC ........ H10B 43/27; H10B 41/27; H10B 43/50; H10B 41/50
See application file for complete search history.

(56) References Cited

U.S. PATENT DOCUMENTS 9,853,038 B1 * 12/2017 Cui ................. H10B 43/35
10,269,820 B1 4/2019 Kaminaga
(Continued)

FOREIGN PATENT DOCUMENTS

| CN | 101364615 A | 2/2009 |
| CN | 106449648 A | 2/2017 |

(Continued)

OTHER PUBLICATIONS

International Search Report issued in corresponding International Application No. PCT/CN2020/113925, dated May 27, 2021, 4 pages.

*Primary Examiner* — John A Bodnar
(74) *Attorney, Agent, or Firm* — BAYES PLLC

(57) ABSTRACT

Three-dimensional (3D) memory devices and methods for forming the 3D memory devices are provided. In one example, a 3D memory device includes a substrate and a memory stack including interleaved conductive layers and dielectric layers on the substrate. The memory stack includes a core structure and a staircase structure. The staircase structure is on one side of the memory stack. The 3D memory device also includes a dummy channel structure extending vertically through the staircase structure. The dummy channel structure includes a plurality of sections along a vertical side of the dummy channel structure. The plurality of sections respectively interface with the interleaved conductive layers in the staircase structure. At least one of the plurality of sections includes a non-flat surface at an interface between the at least one of the plurality of sections and a corresponding conductive layer.

20 Claims, 9 Drawing Sheets

(56) References Cited

U.S. PATENT DOCUMENTS

| | | | |
|---|---|---|---|
| 10,741,574 | B2 | 8/2020 | Jung et al. |
| 2020/0176375 | A1 | 6/2020 | Jung et al. |

FOREIGN PATENT DOCUMENTS

| | | | |
|---|---|---|---|
| CN | 106920796 | A | 7/2017 |
| CN | 109037229 | A | 12/2018 |
| CN | 109887917 | A | 6/2019 |
| CN | 111406319 | A | 7/2020 |
| TW | 201813006 | A | 4/2018 |
| TW | 201903975 | A | 1/2019 |
| WO | 2020096674 | A1 | 5/2020 |

\* cited by examiner

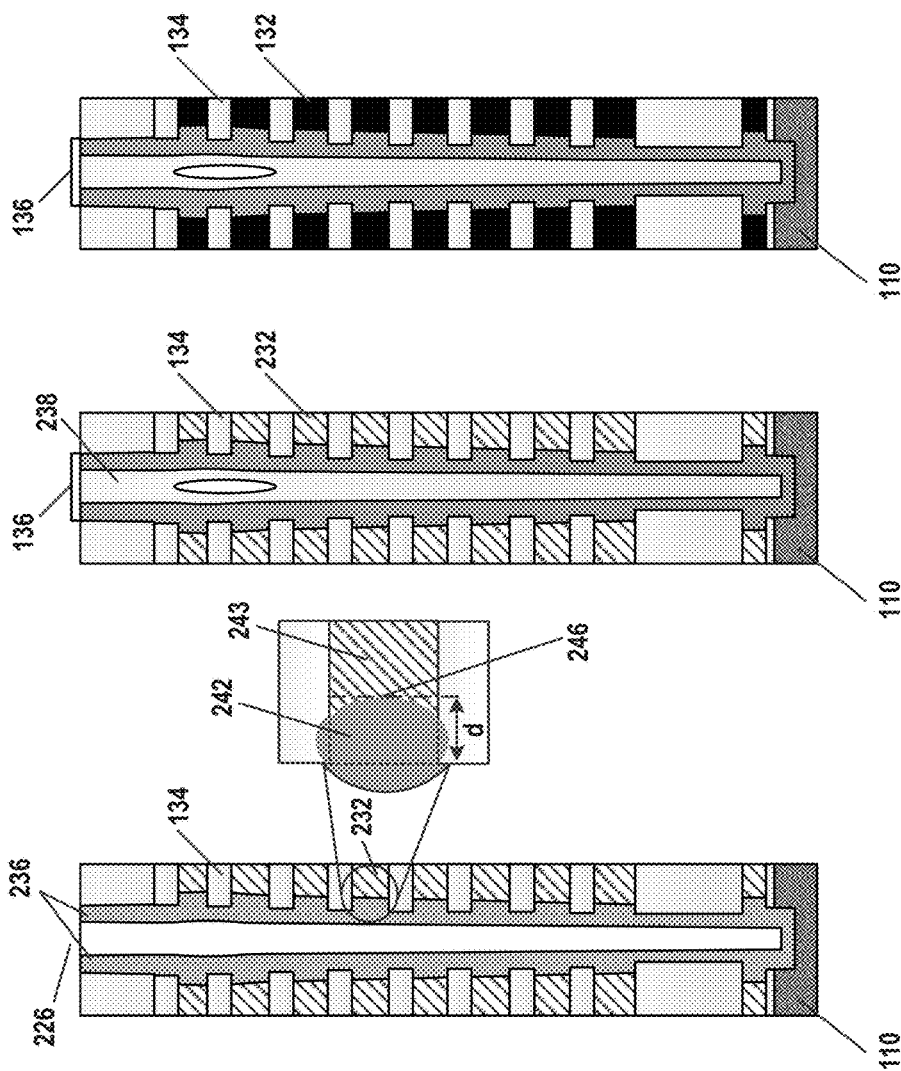
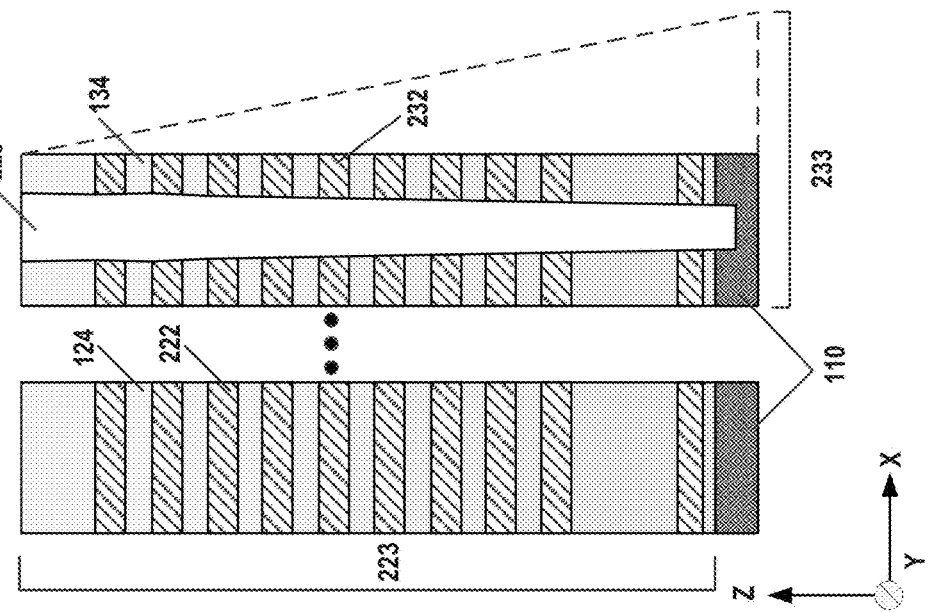
FIG. 2A  FIG. 2B  FIG. 2C  FIG. 2D

THREE-DIMENSIONAL MEMORY DEVICES HAVING DUMMY CHANNEL STRUCTURES AND METHODS FOR FORMING THE SAME

CROSS-REFERENCE TO RELATED APPLICATIONS

This application is continuation of International Application No. PCT/CN2020/113925, filed on Sep. 8, 2020, entitled "THREE-DIMENSIONAL MEMORY DEVICES HAVING DUMMY CHANNEL STRUCTURES AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device is provided. The 3D memory device includes a substrate and a memory stack including interleaved conductive layers and dielectric layers on the substrate. The memory stack includes a core structure and a staircase structure. The staircase structure is on one side of the memory stack. The 3D memory device also includes a dummy channel structure extending vertically through the staircase structure. The dummy channel structure includes a plurality of sections along a vertical side of the dummy channel structure. The plurality of sections respectively interface with the interleaved conductive layers in the staircase structure. At least one of the plurality of sections includes a non-flat surface at an interface between the at least one of the plurality of sections and a corresponding conductive layer.

In another example, a method for forming a 3D memory device is provided. The method includes forming a dielectric stack including interleaved sacrificial layers and dielectric layers on a substrate. The method also includes forming a staircase structure on at least one side of the dielectric stack. The method also includes forming a dummy channel hole extending vertically through the staircase structure. The method also includes forming a first layer of oxide in the dummy channel hole. The first layer of oxide covers at least a portion of a vertical surface of the dummy channel hole. After forming the first layer of oxide, the method includes forming a second layer of oxide filling the dummy channel hole. In addition, the method includes forming interleaved conductive layers and dielectric layers in the staircase structure by replacing the sacrificial layers in the staircase structure with the conductive layers.

In yet another example, a method for forming a 3D memory device is provided. The method includes forming a dielectric stack including interleaved sacrificial layers and dielectric layers on a substrate. The method also includes forming a staircase structure on at least one side of the dielectric stack. The method also includes forming a dummy channel hole extending vertically through the staircase structure. The method also includes forming a dummy channel structure in the dummy channel hole. Forming the dummy channel structure includes oxidizing at least a portion of at least one sacrificial layer exposed by the dummy channel hole. In addition, the method includes forming interleaved conductive layers and dielectric layers in the staircase structure by replacing the sacrificial layers in the staircase structure with the conductive layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2A-2D illustrate an exemplary fabrication process for forming a dummy channel structure of a 3D memory device, according to some embodiments of the present disclosure.

Figure 1:
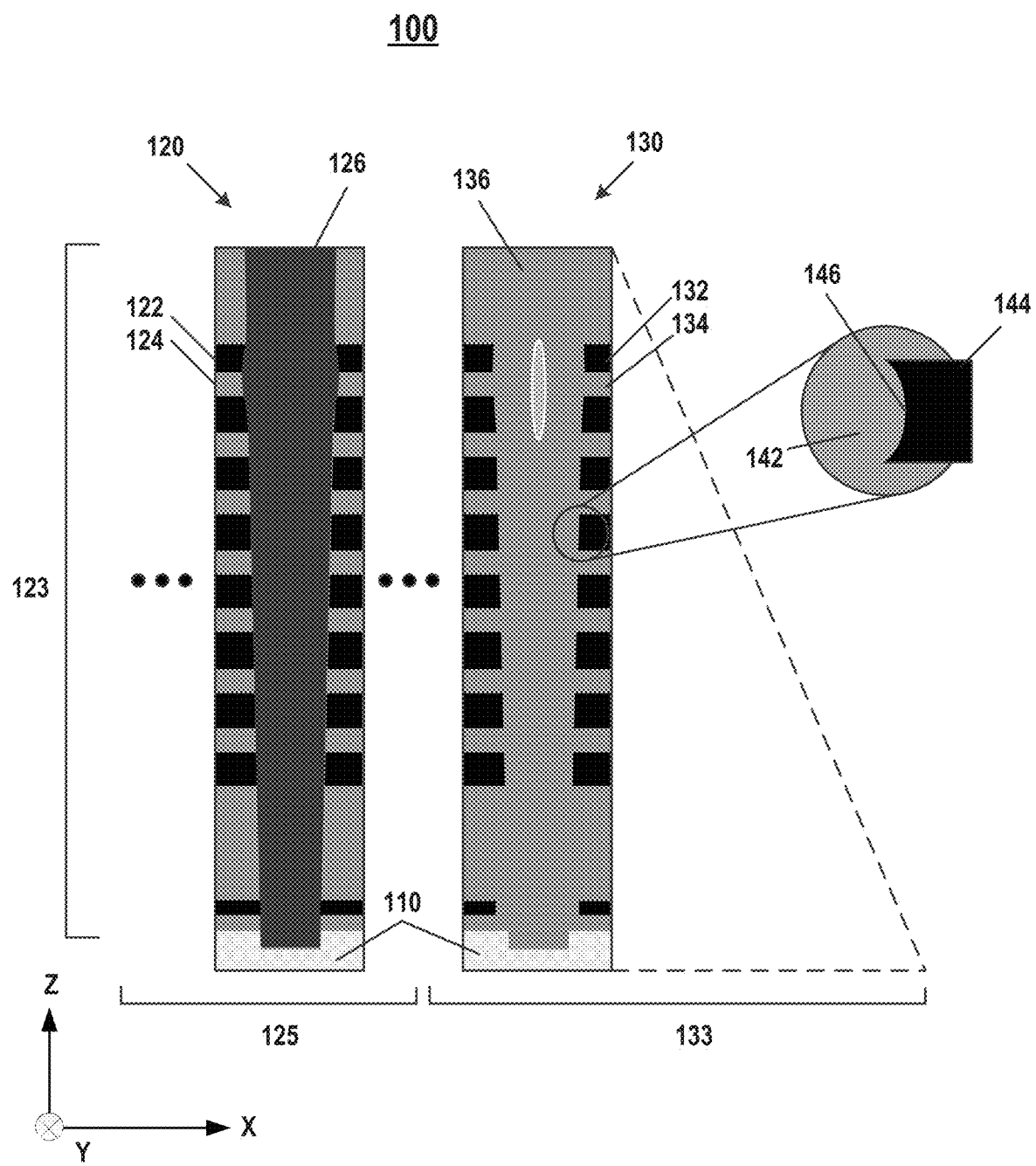
FIG. 1 illustrates a cross-sectional view of a 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Figure 6C:
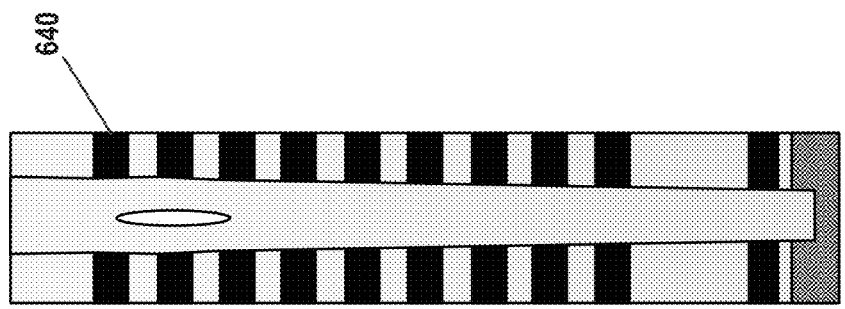
FIGS. 6A-6C illustrate a conventional fabrication process for forming a dummy channel structure.
Figure 6B:
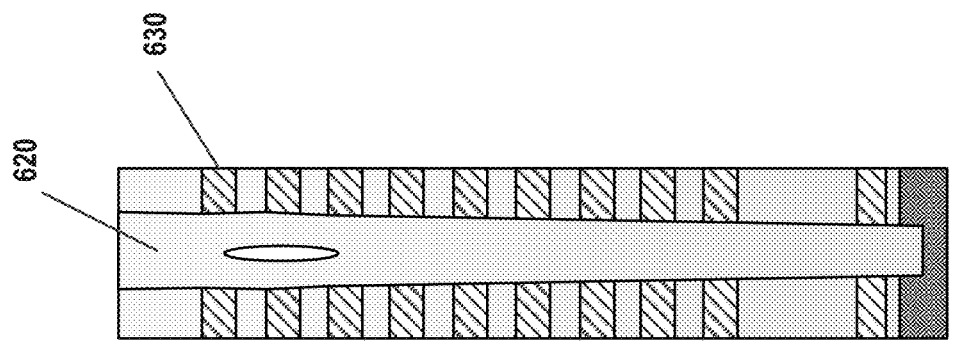
Figure 6A:
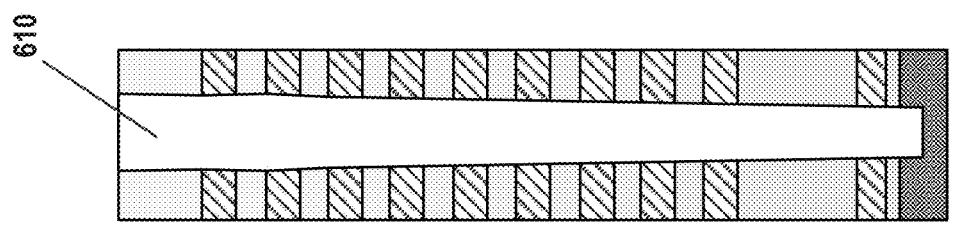
Figure 7:
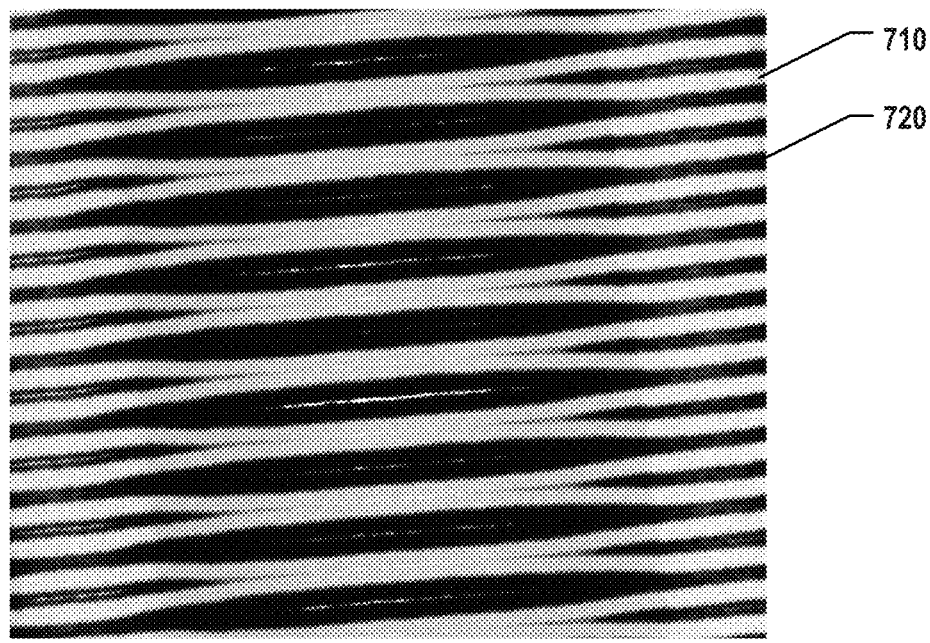
FIG. 7 illustrates an EM image of a collapsed staircase structure.

In 3D memory fabrication processes, dummy channel structures (e.g., formed by filling dummy channel holes with dielectric materials) can be used in staircase structures of a 3D memory device to enhance structural stabilization. Conventional methods of filling dummy channel holes, an example of which is shown in FIGS. 6A-6C, include filing an oxide 620 into a dummy channel hole 610 using a deposition-etch away-deposition (DED) method or a chemical vapor deposition (CVD) method with a relatively low temperature (e.g., less than about 650 degrees Celsius). Oxide 620 filled with these conventional methods are generally of low quality and may not be able to provide sufficient structural support, causing collapse of the staircase structure after a conductive material 640 replaces a sacrificial material 630 in a gate-replacement process because conductive material 640 is usually heavier than the replaced sacrificial material 630. FIG. 7 illustrates an EM image of a collapsed staircase structure resulting from such low-quality oxide-filling methods. As shown in FIG. 7, interleaved dielectric layers 710 (shown as while lines) collapse and are in contact with adjacent dielectric layers after conductive layers 720 (shown as black lines) are formed because the low-quality dummy channel structures are not sufficiently strong to provide structural support.

Embodiments in accordance with the present disclosure provide an improved 3D memory device and methods for forming the same to address the aforementioned issues. The improved 3D memory device includes a strengthened layer in a dummy channel structure formed by an oxidation process performed before filling the corresponding dummy channel hole with an oxide. The oxidation process oxidizes a nitride material added into the dummy channel hole and/or presented in one or more sacrificial layers exposed by the dummy channel hole. The oxidation process can generate an oxide layer extending along the vertical sidewall of the dummy channel hole and may cause expansion of the generated oxide, enhancing the strength and stability of the dummy channel structure to withstand the weight of the conductive layers that later replace the sacrificial layers.

FIG. 1 illustrates a cross-sectional view of an exemplary 3D memory device, according to some embodiments. FIGS. 2A-2D illustrate cross-sectional views of the exemplary 3D memory device at various stages of an exemplary fabrication process, according to some embodiments. FIGS. 3A-3D and 4A-4C illustrate exemplary methods to form a 3D memory device, according to some embodiments. FIGS. 1, 2A-2D, 3A-3D, and 4A-4C will be described together in the following passages.

FIG. 1 illustrates a cross-sectional view of an exemplary 3D memory device 100, according to some embodiments. 3D memory device 100 may include a memory region that includes an inner region 120 (also known as a "core array region") and an outer region 130 (also known as a "staircase region"). In some embodiments, inner region 120 is the center region of the memory region where an array of memory strings (e.g., NAND memory strings) are formed (only one memory string 126 is shown in FIG. 1 for illustration purpose), and outer region 130 is the remaining region of the memory region surrounding inner region 120 (including the sides and edges) without memory strings.

Memory strings such as 126 may be arranged in an array in inner region 120. Memory strings may be arranged in any suitable pattern. Depending on the fabrication and/or design requirements, any suitable number of memory strings may be formed in inner region 120.

Staircase region 130 may include a plurality of dummy channel structures (only one dummy channel structure 136 is shown in FIG. 1 for illustration purpose), as well as other structures such as a plurality of staircase contacts and a plurality of dummy source structures (not shown in FIG. 1). These structures in staircase region 130 may be arranged in any suitable patterns, such as an array.

3D memory device 100 can include a substrate 110, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 110 may be a thinned substrate (e.g., a semiconductor layer), which was thinned by grinding, etching, chemical mechanical polishing (CMP), or any combination thereof.

In FIG. 1, x, y, and z axes/directions are included to illustrate the spatial relationship of the components in 3D memory device 100. Substrate 110 includes two lateral surfaces extending laterally in the x-y plane: a top surface on the front side of the wafer on which 3D memory device 100 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 110) in the z-direction (the vertical direction perpendicular to the x-y plane) when the substrate is positioned in the lowest plane of the semiconductor device in the z-direction. The same notion for describing spatial relationships is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 110) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches, not shown) is flipped and faces down toward the memory array device (e.g., NAND memory strings) for hybrid bonding. It is understood that in some embodiments, the memory array device substrate (e.g., substrate 110) is flipped and faces down toward the peripheral device (not shown) for hybrid bonding, so that in the bonded non-monolithic 3D memory device, the memory array device is above the peripheral device. The memory array device substrate (e.g., substrate 110) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in the form of an array of NAND memory strings 126 each extending vertically above substrate 110. Memory strings 126 can extend through a plurality of pairs each including a conductive layer 122 and a dielectric layer 124 (referred to herein as "conductor/dielectric layer pairs"). The stacked conductor/dielectric layer pairs are also referred to herein as a "memory stack" 123. In some embodiments, an insulation layer (not shown) is formed between substrate 110 and memory stack 123. The number of the conductor/dielectric layer pairs in memory stack 123 (e.g., 32, 64, 96, or 128) determines the number of memory cells in 3D memory device 100. Memory stack 123 can include interleaved conductive layers 122 and dielectric layers 124. At least on one side in the lateral direction, memory stack 123 can include a staircase structure 133, whereas the central region where memory strings are located may include a core structure 125. Conductive layers 122 and dielectric layers 124 in memory stack 123 can alternate in the vertical direction. Conductive layers 122 and dielectric layers 124 in core structure 125 may extend to staircase structure 133 and become conductive layers 132 and dielectric layers 134. In other words, for ease of description, the conductive layers and dielectric layers in staircase structure 133 are denoted as 132 and 134, respectively. Conductive layers 122/132 can include conductive materials including, but not limited to, tungsten (W), cobalt (Co), copper (Cu), aluminum (Al), polysilicon, doped silicon, silicides, or any combination thereof. Dielectric layers 124/134 can include dielectric materials including, but not limited to, silicon oxide, silicon nitride, silicon oxynitride, or any combination thereof.

Memory string 126 can include a channel structure (not shown) extending vertically through memory stack 123. The channel structure can include a channel hole filled with semiconductor materials (e.g., as a semiconductor channel) and dielectric materials (e.g., such as a memory film). In some embodiments, the semiconductor channel may include silicon, such as amorphous silicon, polysilicon, or single crystalline silicon. In some embodiments, the memory film may be a composite layer including a tunneling layer, a storage layer (also known as a "charge trap layer"), and a blocking layer. The remaining space of the channel hole can be partially or fully filled with a capping layer including dielectric materials, such as silicon oxide. The channel structure can have a cylinder shape (e.g., a pillar shape). The capping layer, the semiconductor channel, the tunneling layer, the storage layer, and the blocking layer can be arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the memory film can include a composite layer of silicon oxide/silicon oxynitride (or silicon nitride)/silicon oxide (ONO).

In some embodiments, conductive layer 122 in memory stack 123 functions as a gate electrode/gate conductor/gate line of memory cells in memory string 126. Conductive layer 122 can include multiple control gates of multiple NAND memory cells and can extend laterally as a word line ending at the edge of memory stack 123 (e.g., in staircase structure 133 of memory stack 123). In some embodiments, the word lines extend in the x-direction perpendicular to both the y-direction and z-direction. The bit lines extend in the y-direction perpendicular to both the x-direction and z-direction. In some embodiments, memory cell transistors in memory string 126 include gate conductors (e.g., parts of conductive layers 122 that abut the channel structure) made from tungsten, adhesion layers (not shown) including titanium/titanium nitride (Ti/TiN) or tantalum/tantalum nitride (Ta/TaN), gate dielectric layers (not shown) made from high-k dielectric materials, and the channel structure.

In some embodiments, 3D memory device 100 further includes dummy channel structures such as dummy channel structure 136. Each dummy channel structure (e.g., 136) may extend vertically through staircase structure 133. Dummy channel structure 136 may include dielectric materials such as silicon oxide. In some embodiments, dummy channel structure 136 may reach substrate 110 and in contact with substrate 110.

Figure 3A:
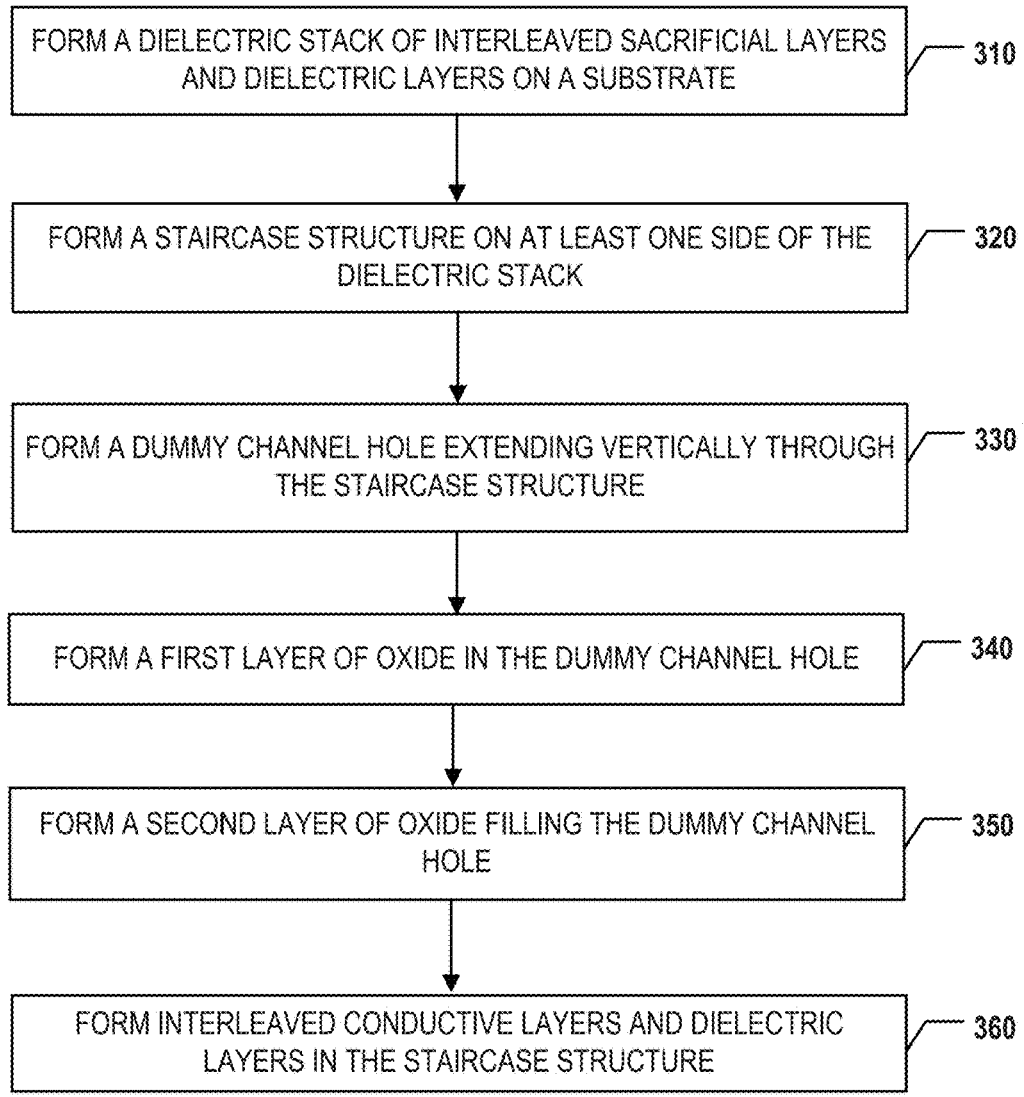
FIGS. 3A-3D illustrate a flowchart of an exemplary method for forming a 3D memory device, according to some embodiments of the present disclosure.
Figure 3B:
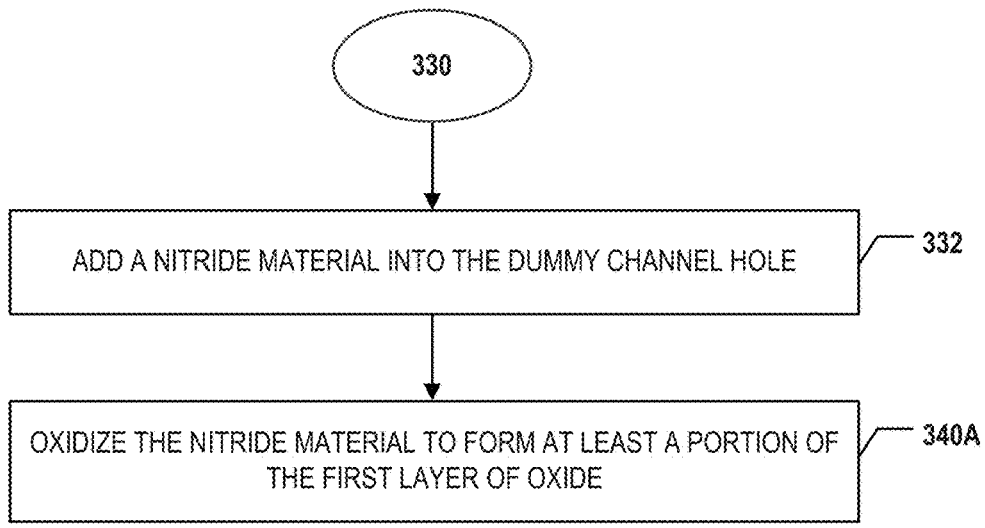
Figure 3C:
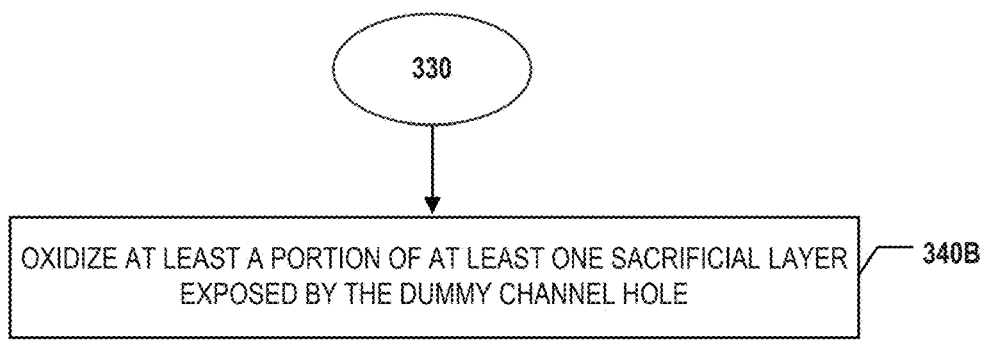
Figure 3D:
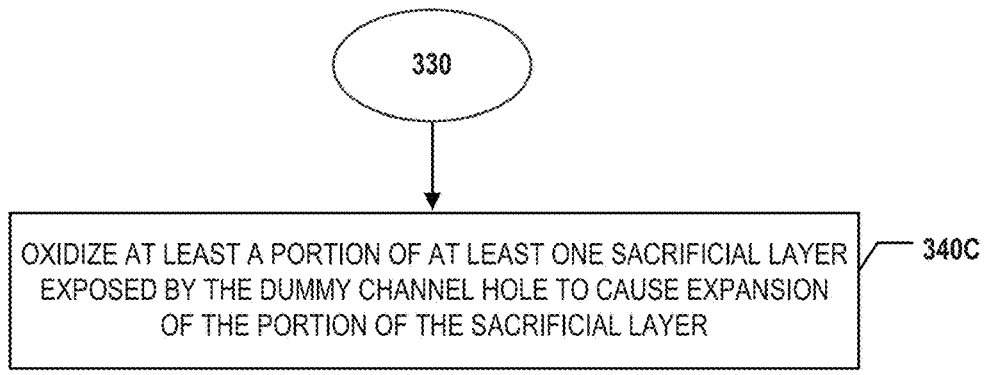
Figure 4A:
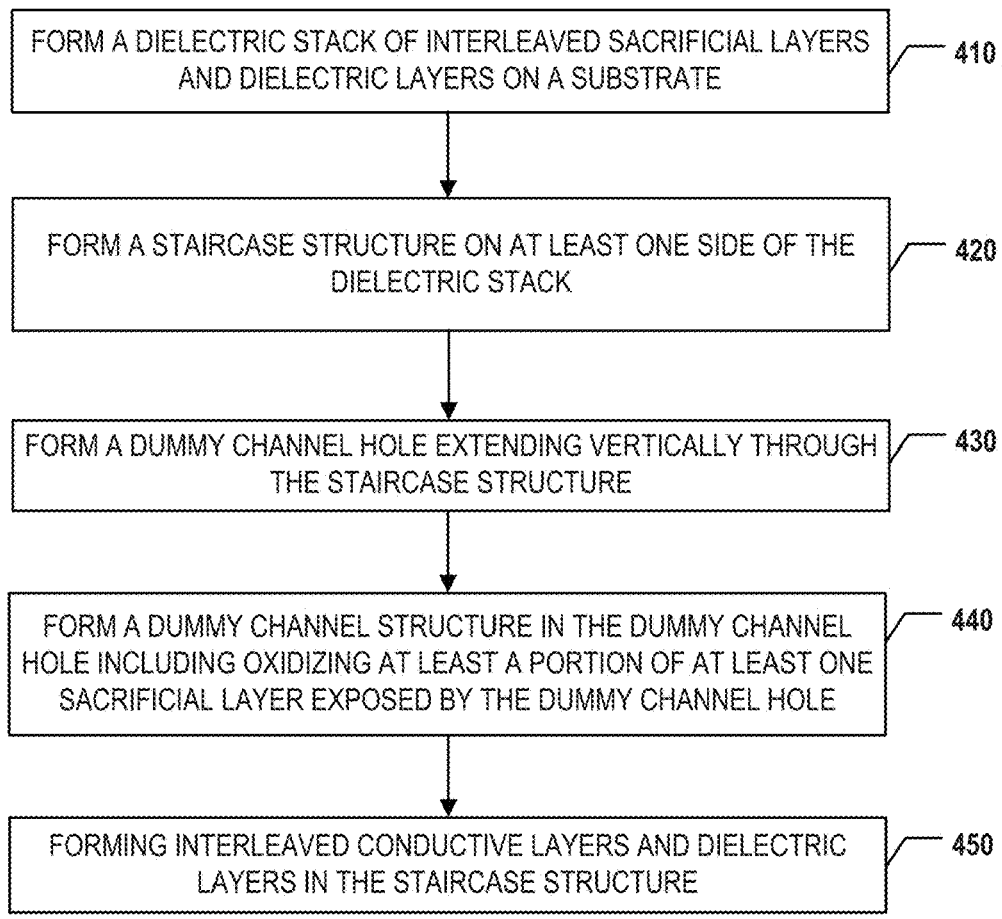
FIGS. 4A-4C illustrate a flowchart of another exemplary method for forming a 3D memory device, according to some embodiments of the present disclosure.
Figure 4B:
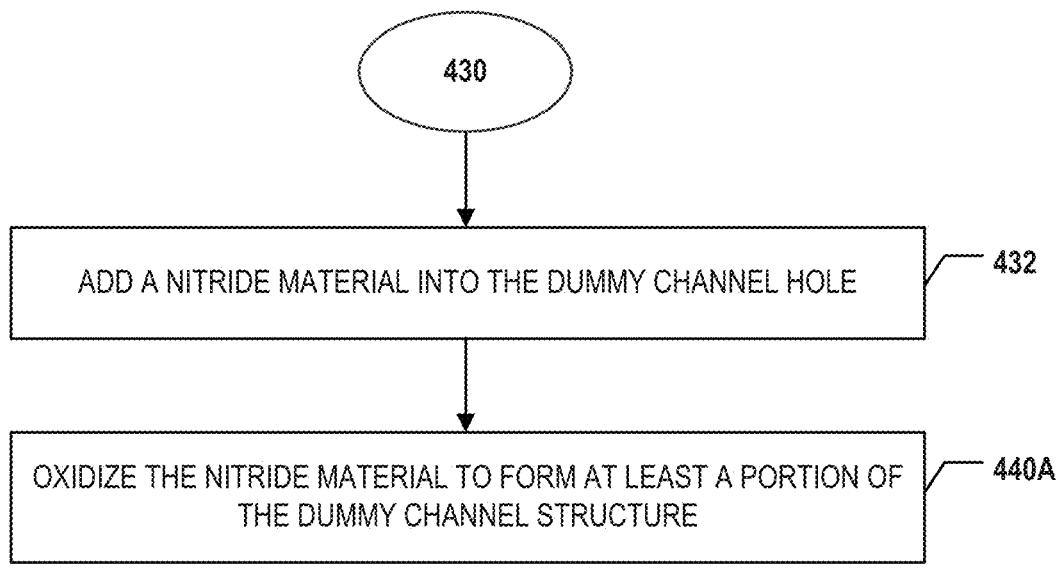
Figure 4C:
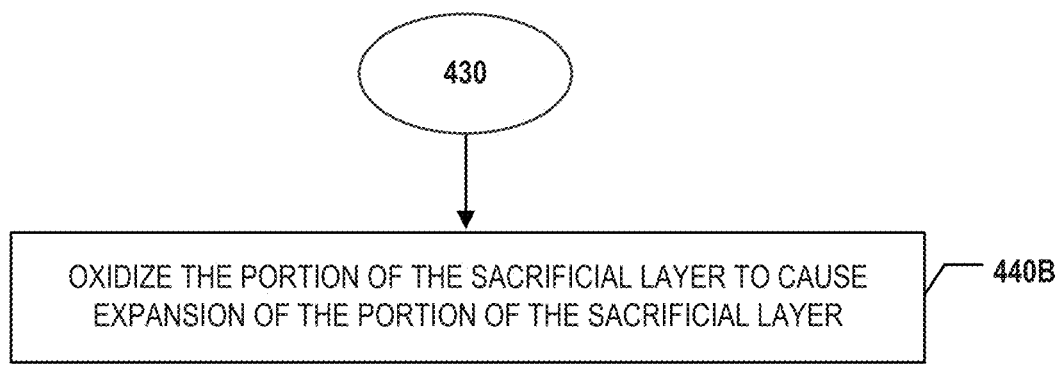

3D memory device 100 depicted in FIG. 1 can be fabricated using method 300 shown in FIGS. 3A-3D and/or method 400 shown in FIGS. 4A-4C. Various stages of the fabrication process are shown in FIGS. 2A-2D. It is understood that the operations shown in methods 300 and 400 are not exhaustive and that other operations can be performed as well before, after, or between any of the illustrated operations. Further, some of the operations may be performed simultaneously, or in a different order than shown in FIGS. 3A-3D and 4A-4C.

Referring to FIG. 3A, method 300 starts at operation 310, in which a dielectric stack is formed on a substrate. For example, as shown in FIG. 2A, a dielectric stack 223 may be formed on substrate 110. In some embodiments, substrate 110 can be a silicon substrate. Dielectric stack 223 can include interleaved sacrificial layers 222 and dielectric layers 124, which can be alternatingly deposited on substrate 110. In some embodiments, each dielectric layer 124 may include a layer of silicon oxide, and each sacrificial layer 222 may include a layer of silicon nitride. Dielectric stack 223 can be formed by one or more thin film deposition processes including, but not limited to, chemical vapor deposition (CVD), physical vapor deposition (PVD), atomic layer deposition (ALD), or any combination thereof. In some embodiments, an insulation layer may be formed between substrate 110 and dielectric stack 223 by depositing dielectric materials, such as silicon oxide, on substrate 110.

Referring back to FIG. 3A, method 300 proceeds to operation 320, in which a staircase structure is formed on at least one side of the dielectric stack. For example, as shown in FIG. 2A, a staircase structure 233 may be formed on one side of dielectric stack 223. Staircase structure 233 can be formed by the so-called "trim-etch" processes, which, in each cycle, trim (e.g., etching incrementally and inwardly, often from all directions) a patterned photoresist layer, followed by etching the exposed portions of the dielectric/sacrificial layer pair using the trimmed photoresist layer as an etch mask to form one step of staircase structure 233. For ease of illustration, the majority part of staircase structure 233 is simplified using a dash-line slope in FIG. 2A, and only a portion of staircase structure 233 around a dummy channel structure is illustrated in more detail. As shown in the illustrated portion, staircase structure 233 includes interleaved dielectric layers 134 and sacrificial layers 232, which may be extended from the corresponding dielectric layers 124 and sacrificial layers 222, respectively, in the central part of dielectric stack 223.

Referring back to FIG. 3A, method 300 proceeds to operation 330, in which a dummy channel hole is formed extending vertically through the staircase structure. In some embodiments, a plurality of dummy channel holes can be formed through the staircase structure by, e.g., performing an anisotropic etching process to remove portions of the staircase structure using an etch mask. In some embodiments, the plurality of dummy channel holes may also be simultaneously formed with a plurality of dummy source holes and/or a plurality of channel holes in the dielectric stack by the same etching process.

As illustrated in FIG. 2A, a dummy channel hole 226 can be formed through staircase structure 233. Dummy channel hole 226 may extend vertically (along the z-direction) through staircase structure 233. In some embodiments, an etching mask (not shown) is patterned on dielectric stack 223 or staircase structure 233 by photolithography, development, and etching. The etching mask can be a photoresist mask or a hard mask patterned based on a photolithography mask. The etching mask can have patterns of one or more dummy channel holes thereon. In some embodiments, the photolithography mask and/or etching mask may also include other types of holes, such as dummy source holes and/or channel holes. Using the patterned etching mask, parts of staircase structure 233 are etched through by one or more wet etching and/or dry etching processes, such as DRIE, to form dummy channel hole 226. In some embodiments, dummy channel hole 226 may extend vertically further into the upper portion of substrate 110, as shown in FIG. 2A.

Referring back to FIG. 3A, method 300 proceeds to operation 340, in which a first layer of oxide is formed in the dummy channel hole. The first layer of oxide may be formed in various ways. For example, referring to FIG. 3B, a nitride material may be added into the dummy channel hole in operation 332 following operation 330. Then, operation 340 may be implemented as operation 340A, in which the added nitride material is oxidized to form at least a portion of the first layer of oxide. The nitride material added in operation 332 may include silicon nitride, and the oxidation process in operation 340A may oxidize the silicon nitride into silicon oxide. Alternatively or additionally, operation 340 may be implemented as operation 340B shown in FIG. 3C, in which at least a portion of at least one sacrificial layer exposed by the dummy channel hole is oxidized. It is noted that the portion of the sacrificial layer may be oxidized in operation 340B with or without the added nitride material. In another example, as shown in FIG. 3D, operation 340 may be implemented as operation 340C, in which at least a portion of at least one sacrificial layer exposed by the dummy channel hole is oxidized to cause expansion of the portion of the sacrificial layer. It is noted that the oxidized portion resulting from operation 340B may or may not expand. The expansion of the oxidized portion resulting from operation 340C may further enhance the strength and stability of the dummy channel structure formed by method 300.

As shown in FIG. 2B, a first oxide layer 236 may be formed and may cover at least a portion of a vertical surface of dummy channel hole 226. In some embodiments, a nitride material, such as silicon nitride, may be added into dummy channel hole 226, as shown in operation 332 in FIG. 3B. The nitride material may be added through depositing a layer of the nitride material onto the bottom and sidewall of dummy channel hole 226. Then, an oxidation process may be performed to oxidize the added nitride material to form a layer of oxide (e.g., silicon oxide). In some embodiments, no nitride material may be added, and the oxidation process may be performed to oxide the nitride material (e.g., silicon nitride) presented in the sacrificial layers, such as sacrificial layer 232, that are exposed by dummy channel hole 226. In any case, the oxidation process may be performed to oxide at least a portion of sacrificial layer 232. For example, as shown in FIG. 2B, portion 242 of sacrificial layer 232 may be oxidized by the oxidation process, shrinking the length of sacrificial layer 232 by about d. The oxidized portion 242 and the remaining portion 243 that is not oxidized (which may further extend toward further right not shown in FIG. 2B) may interface with each other at an interface 246.

In some embodiments, the oxidation process may cause expansion of the oxidized portion. As shown in FIG. 2B, oxidized portion 242 may expand in one or more directions. For example, the expansion may be toward the right side, or along a lateral direction away from dummy channel hole 226, creating a non-flat surface protruding toward the remaining portion 243 at interface 246. The expansion may also be toward up and/or down, or along a vertical direction toward the adjacent dielectric layer(s). Such up-/down-ward expansion may tighten and strengthen the grip of oxide layer 236 by the dielectric layers exposed by dummy channel hole 226, thereby enhancing the overall stability of the dummy channel structure formed by method 300.

In some embodiments, the non-flat surface at interface 246 may include a convex-shaped surface, as shown in FIG. 2B. It is noted that the convex shape may not be a perfect convex nor resemble a smooth curvature. Rather, the convex-shaped surface may include nonsymmetrical curves, rough edges, or even small discontinuities. The overall shape, however, generally resembles a convex shape.

In some embodiments, oxidized portion 242 may be about 1% to 10% of sacrificial layer 232. In other words, the length d may be about 1% to 10% of the overall length of sacrificial layer 232, which may include additional parts further extending to the right not shown in FIG. 2B. In some embodiments, oxidized portion 242 is about 5 nanometers to 15 nanometers (e.g., d is about 5 nanometers to 15 nanometers).

Oxidation of the nitride material, either added into dummy channel hole 226 or presented in sacrificial layer 232, may be performed using various methods. For example, an in-situ steam generation (ISSG) operation may be performed to oxidize the nitride material. The ISSG operation may include adding steam, for example, created using oxygen gas and hydrogen gas directly without pre-combustion, into dummy channel hole 226 to oxidize the nitride material. ISSG operation may produce thin oxide film with excellent oxide quality. In another example, an ion implantation operation may be performed to oxidize the nitride material. In another example, a dry oxidation operation may be performed to oxidize the nitride material. In any case, the temperature used for oxidizing the nitride material may be relatively higher, such as about 850 degrees Celsius, higher than the temperature used in conventional methods. The elevated temperature used in the oxidation process may further strengthen the first oxide layer 236.

After forming the first layer of oxide in operation 340, method 300 proceeds to operation 350, as shown in FIG. 3A. In operation 350, a second layer of oxide may be formed, filling the dummy channel hole. Referring to FIG. 2C, a second layer of oxide 238, such as silicon oxide, may be formed to fill dummy channel hole 226. The second layer of oxide 238 can be formed in any suitable methods, such as DED, CVD, PVD, ALD, or any combination thereof. The combination of first and second layers of oxide may form the dummy channel structure 136. Because first oxide layer 236 provides enhanced stability, the overall strength and stability of dummy channel structure 136 can be improved.

Referring back to FIG. 3A, method 300 proceeds to operation 360, in which interleaved conductive layers and dielectric layers are formed in the staircase structure. In some embodiments, forming the interleaved conductive layers and dielectric layers includes performing a gate-replacement process, in which the conductive layers replace the sacrificial layers.

As illustrated in FIG. 2D, sacrificial layers such as 232 (shown in FIG. 2C) may be removed by wet etching and/or dry etching. Conductive layers such as 132 can then be formed by filling in lateral recesses previously occupied by sacrificial layers. Conductive layers can include conductive materials including, but not limited to, W, Co, Cu, Al, polysilicon, silicides, or any combination thereof. Conductive layers thereby replace sacrificial layers to transfer dielectric stack 223 into memory stack 123.

Method 400 shown in FIGS. 4A-4C is similar to method 300. For example, operations 410, 420, 430, and 450 are similar to operations 310, 320, 330, and 360, respectively. In operation 440, a dummy channel structure is formed in the dummy channel hole. The formation of the dummy channel structure includes oxidizing at least a portion of at least one sacrificial layer exposed by the dummy channel hole. For example, referring to FIGS. 2B and 2C, dummy channel structure 136 can be formed by oxidizing a portion of the sacrificial layers (e.g., portion 242 of sacrificial layer 232), followed by filling the remaining space of dummy channel hole 226 with oxide 238. The oxidation process is similar to operation 340. For example, ISSG, ion implantation, and/or dry oxidation operations may be performed to oxidize a nitride material. As shown in FIG. 4B, the nitride material can be added into dummy channel hole 226, as shown in operation 432 (similar to operation 332). In this case, operation 440 may be implemented as operation 440A, in which the added nitride material can be oxidized to form at least a portion of dummy channel structure 136, such as oxide layer 236. Alternatively or additionally, nitride material may not be added into dummy channel hole 226, and operation 440 may be implemented as operation 440B, in which the portion of the sacrificial layer may be oxidized to cause expansion of the oxidized portion, similar to operation 340C. The degree, manner, and shape of the expansion may be similar to those described above in connection with method 300. The temperature of the oxidation process may also be similar to that described above in connection with method 300.

Referring back to FIG. 1, dummy channel structure 136 formed by method 300 or 400 may include a plurality of sections along a vertical side of the dummy channel structure, such as section 142. As shown in FIG. 1, the plurality of sections may respectively interface with the interleaved conductive layers, such as conductive layer 144. Section 142, which is formed by oxidizing a portion of the sacrificial layer (e.g., 242) and resulting from the expansion caused by the oxidation, may exhibit a non-flat surface 146 at the interface between section 142 and conductive layer 144. Non-flat surface 146 may include all of the features of portion 242 described above in connection with FIG. 2B, including its protrusion toward conductive layer 144 and its convex-shaped surface. Correspondingly, conductive layer 144, resulting from the gate-replacement process, may include all of the geometrical features of portion 243. For example, conductive layer 144 may include a second non-flat surface at the interface and may match the non-flat surface of section 142. For instance, as shown in FIG. 1, the non-flat surface of conductive layer 144 may depress away from section 142 and may include a concave-shaped surface.

Figure 5:
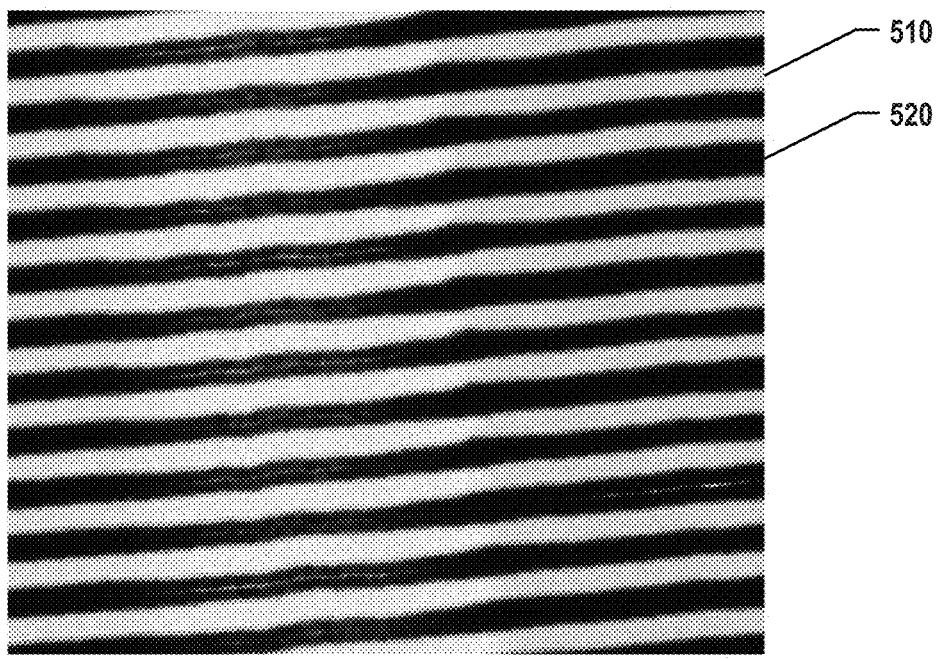
FIG. 5 illustrates an electron microscope (EM) image of a staircase structure with an improved dummy channel structure, according to some embodiments of the present disclosure.

FIG. 5 illustrates an EM image of a staircase structure with improved dummy channel structure (e.g., 136) formed using method 300 or method 400. As shown in FIG. 5, dielectric layers 510 (white lines) can provide sufficient support to conductive layers 520 (black lines). No collapse occurs.

In some embodiments, a 3D memory device includes a substrate; a memory stack including interleaved conductive layers and dielectric layers on the substrate, wherein the memory stack includes a core structure and a staircase structure, the staircase structure being on one side of the memory stack; and a dummy channel structure extending vertically through the staircase structure, wherein the dummy channel structure includes a plurality of sections along a vertical side of the dummy channel structure, the plurality of sections respectively interfacing with the interleaved conductive layers in the staircase structure, wherein at least one of the plurality of sections includes a non-flat surface at an interface between the at least one of the plurality of sections and a corresponding conductive layer.

In some embodiments, the non-flat surface protrudes toward the corresponding conductive layer.

In some embodiments, the non-flat surface includes a convex-shaped surface.

In some embodiments, the corresponding conductive layer includes a second non-flat surface at the interface.

In some embodiments, the second non-flat surface depresses away from the at least one of the plurality of sections.

In some embodiments, the second non-flat surface includes a concave-shaped surface.

In some embodiments, the dummy channel structure is in contact with the substrate.

In some embodiments, a method for forming a 3D memory device includes the following operations. First, a dielectric stack including interleaved sacrificial layers and dielectric layers is formed on a substrate. A staircase structure on at least one side of the dielectric stack is formed. A first layer of oxide in the dummy channel hole is formed, the first layer of oxide covering at least a portion of a vertical surface of the dummy channel hole. After forming the first layer of oxide, a second layer of oxide is formed, filling the dummy channel hole. Finally, interleaved conductive layers and dielectric layers are formed in the staircase structure by replacing the sacrificial layers in the staircase structure with the conductive layers.

In some embodiments, the method includes adding a nitride material into the dummy channel hole. Forming the first layer of oxide in the dummy channel hole includes oxidizing the nitride material to form at least a portion of the first layer of oxide.

In some embodiments, forming the first layer of oxide in the dummy channel hole includes oxidizing at least a portion of at least one sacrificial layer exposed by the dummy channel hole.

In some embodiments, oxidizing at least a portion of the sacrificial layer exposed by the dummy channel hole includes oxidizing the portion of the sacrificial layer to cause expansion of the portion of the sacrificial layer.

In some embodiments, the oxidized portion of the sacrificial layer includes a non-flat surface.

In some embodiments, the non-flat surface protrudes toward a remaining portion of the sacrificial layer that is not oxidized.

In some embodiments, the non-flat surface includes a convex-shaped surface.

In some embodiments, the oxidized portion of the sacrificial layer is about 1% to 10% of the sacrificial layer.

In some embodiments, the oxidized portion of the sacrificial layer is about 5 nanometers to 15 nanometers.

In some embodiments, oxidizing the portion of the sacrificial layer includes oxidizing the portion of the sacrificial layer using an ISSG operation.

In some embodiments, oxidizing the portion of the sacrificial layer includes oxidizing the portion of the sacrificial layer using an ion implantation operation.

In some embodiments, oxidizing the portion of the sacrificial layer includes oxidizing the portion of the sacrificial layer using a dry oxidation operation.

In some embodiments, forming the first layer of oxide includes forming the first layer of oxide with a first temperature. Forming the second layer of oxide includes forming the second layer of oxide with a second temperature that is lower than the first temperature.

In some embodiments, the first temperature is about 850 degrees Celsius.

In some embodiments, forming the first layer of oxide includes forming the first layer of oxide with a temperature of about 850 degrees Celsius.

A method for forming a three-dimensional (3D) memory device includes forming a dielectric stack including interleaved sacrificial layers and dielectric layers on a substrate, and forming a staircase structure on at least one side of the dielectric stack. The method also includes forming a dummy channel hole extending vertically through the staircase structure and forming a dummy channel structure in the dummy channel hole. Forming the dummy channel structure includes oxidizing at least a portion of at least one sacrificial layer exposed by the dummy channel hole. The method also includes forming interleaved conductive layers and dielectric layers in the staircase structure by replacing the sacrificial layers in the staircase structure with the conductive layers.

In some embodiments, the method includes adding a nitride material into the dummy channel hole. Forming the dummy channel structure includes oxidizing the nitride material to form at least a portion of the dummy channel structure.

In some embodiments, oxidizing at least a portion of the sacrificial layer exposed by the dummy channel hole includes oxidizing the portion of the sacrificial layer to cause expansion of the portion of the sacrificial layer.

In some embodiments, the oxidized portion of the sacrificial layer includes a non-flat surface.

In some embodiments, the non-flat surface protrudes toward a remaining portion of the sacrificial layer that is not oxidized.

In some embodiments, the non-flat surface includes a convex-shaped surface.

In some embodiments, the oxidized portion of the sacrificial layer is about 1% to 10% of the sacrificial layer.

In some embodiments, the oxidized portion of the sacrificial layer is about 5 nanometers to 15 nanometers.

In some embodiments, oxidizing the portion of the sacrificial layer includes oxidizing the portion of the sacrificial layer using an ISSG operation.

In some embodiments, oxidizing the portion of the sacrificial layer includes oxidizing the portion of the sacrificial layer using an ion implantation operation.

In some embodiments, oxidizing the portion of the sacrificial layer includes oxidizing the portion of the sacrificial layer using a dry oxidation operation.

In some embodiments, forming the dummy channel structure includes forming at least a portion of the dummy channel structure with a temperature of about 850 degrees Celsius.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a memory stack comprising interleaved conductive layers and dielectric layers on the substrate, wherein the memory stack comprises a core structure and a staircase structure, the staircase structure being on one side of the memory stack; and
   a dummy channel structure extending vertically through the staircase structure, wherein the dummy channel structure comprises a plurality of sections along a vertical side of the dummy channel structure, the plurality of sections respectively interfacing with the interleaved conductive layers in the staircase structure, wherein at least one of the plurality of sections comprises a non-flat surface having a vertically-oriented curvature at an interface between the at least one of the plurality of sections and a corresponding conductive layer.

2. The 3D memory device of claim 1, wherein the non-flat surface protrudes toward the corresponding conductive layer.

3. The 3D memory device of claim 1, wherein the non-flat surface comprises a convex-shaped surface.

4. The 3D memory device of claim 1, wherein the corresponding conductive layer comprises a second non-flat surface at the interface.

5. The 3D memory device of claim 4, wherein the second non-flat surface curves inwardly away from the interface.

6. The 3D memory device of claim 4, wherein the second non-flat surface comprises a concave-shaped surface.

7. A method for forming a three-dimensional (3D) memory device, comprising:
   forming a dielectric stack comprising interleaved sacrificial layers and dielectric layers on a substrate;
   forming a staircase structure on at least one side of the dielectric stack;
   forming a dummy channel hole extending vertically through the staircase structure;
   forming a first layer of oxide in the dummy channel hole, the first layer of oxide covering a least a portion of a vertical surface of the dummy channel hole;
   after forming the first layer of oxide, forming a second layer of oxide filling the dummy channel hole; and
   forming interleaved conductive layers and dielectric layers in the staircase structure by replacing the sacrificial layers in the staircase structure with the conductive layers.

8. The method of claim 7, comprising:
   adding a nitride material into the dummy channel hole;
   wherein forming the first layer of oxide in the dummy channel hole comprises oxidizing the nitride material to form at least a portion of the first layer of oxide.

9. The method of claim 7, wherein forming the first layer of oxide in the dummy channel hole comprises oxidizing at least a portion of at least one sacrificial layer exposed by the dummy channel hole.

10. The method of claim 9, wherein oxidizing at least a portion of the sacrificial layer exposed by the dummy channel hole comprises oxidizing the portion of the sacrificial layer to cause expansion of the portion of the sacrificial layer.

11. The method of claim 9, wherein the oxidized portion of the sacrificial layer is about 1% to 10% of the sacrificial layer.

12. The method of claim 9, wherein the oxidized portion of the sacrificial layer is about 5 nanometers to 15 nanometers.

13. The method of claim 9, wherein oxidizing the portion of the sacrificial layer comprises oxidizing the portion of the sacrificial layer using an in-situ steam generation (ISSG) operation.

14. The method of claim 9, wherein oxidizing the portion of the sacrificial layer comprises oxidizing the portion of the sacrificial layer using an ion implantation operation.

15. The method of claim 9, wherein oxidizing the portion of the sacrificial layer comprises oxidizing the portion of the sacrificial layer using a dry oxidation operation.

16. The method of claim 7, wherein:
forming the first layer of oxide comprises forming the first layer of oxide with a first temperature; and
forming the second layer of oxide comprises forming the second layer of oxide with a second temperature that is lower than the first temperature.

17. The method of claim 16, wherein the first temperature is about 850 degrees Celsius.

18. The method of claim 7, wherein:
forming the first layer of oxide comprises forming the first layer of oxide with a temperature of about 850 degrees Celsius.

19. A method for forming a three-dimensional (3D) memory device, comprising:
forming a dielectric stack comprising interleaved sacrificial layers and dielectric layers on a substrate;
forming a staircase structure on at least one side of the dielectric stack;
forming a dummy channel hole extending vertically through the staircase structure;
forming a dummy channel structure in the dummy channel hole, wherein forming the dummy channel structure comprises oxidizing at least a portion of at least one sacrificial layer exposed by the dummy channel hole; and
forming interleaved conductive layers and dielectric layers in the staircase structure by replacing the sacrificial layers in the staircase structure with the conductive layers.

20. The method of claim 19, wherein oxidizing at least a portion of the sacrificial layer exposed by the dummy channel hole comprises oxidizing the portion of the sacrificial layer to cause expansion of the portion of the sacrificial layer.

* * * * *